United States Patent [19]

Fulcomer et al.

[11] Patent Number: 5,412,580
[45] Date of Patent: May 2, 1995

[54] PSEUDO-RANDOM VECTOR GENERATED TESTABLE COUNTER

[75] Inventors: James L. Fulcomer, Redondo Beach; William D. Farwell, Thousand Oaks, both of Calif.

[73] Assignee: Hughes Aircraft Company, Los Angeles, Calif.

[21] Appl. No.: 725,124

[22] Filed: Jul. 3, 1991

[51] Int. Cl.[6] .......................................... G01R 31/28
[52] U.S. Cl. ................................ 364/489; 371/27; 371/22.5
[58] Field of Search ............... 364/488, 489; 371/21.1, 371/21.3, 22.1, 22.5, 22.6, 27

[56] References Cited

U.S. PATENT DOCUMENTS

| | | | |
|---|---|---|---|
| 4,667,301 | 5/1987 | Chiu et al. | 364/717 |
| 4,730,319 | 3/1988 | David et al. | 371/27 |
| 4,789,821 | 12/1988 | Baschiera et al. | 371/22.4 |
| 4,982,403 | 1/1991 | Du Chene et al. | 371/22.4 |
| 5,006,787 | 4/1991 | Katiricioglu et al. | 371/21.2 |
| 5,138,619 | 8/1992 | Fasang et al. | 371/21.1 |

*Primary Examiner*—Vincent N. Trans
*Attorney, Agent, or Firm*—Leonard A. Alkov; Wanda K. Denson-Low

[57] ABSTRACT

A digital counter which can be easily and thoroughly tested with a short sequence of random or pseudo-random input vectors. The counter includes a pair of pseudo-random input generators, probability regeneration logic and full scale observability logic. The counter has improved capability to detect stuck at faults in the counter full scale output gates. The counter is particularly advantageous in a VLSI circuit design.

18 Claims, 4 Drawing Sheets

5,412,580

PSEUDO-RANDOM VECTOR GENERATED TESTABLE COUNTER

BACKGROUND OF THE INVENTION

The present invention relates to digital counters, and more particularly to a digital counter which can be easily and thoroughly tested with a short sequence of random (or pseudo-random) input vectors.

A growing concern associated with the production and use of VLSI chips is the problem of testing for defects in the chip. Fault testing is required at several stages of a chip's life. The first time that testing of the chip is required is when the chip is still part of a wafer. Since the yield for VLSI chips is relatively low, the chip manufacturer must run a manufacturing test on all the chips on the wafer to weed out the bad ones. This involves testing the chip with a set of vectors supplied by the designer in order to ensure that a good chip is being delivered. In the past, a manufacturing test was accomplished by externally applying specially designed test vectors to the chip inputs that would either excite the internal logic directly, or by serially loading set scan chains. The result of the excitation was observed either directly at the chip output or by shifting out set scan chains. These results were then compared to expected results by test support equipment. Designing a set of manufacturing test vectors that would adequately test the chip required an engineer to have in depth knowledge of the internal logic of the chip. As VLSI chips become denser, this task becomes extremely time consuming, and the increased number of vectors necessary to test the chip means that manufacturing tests take longer to run and require more expensive support equipment.

Once a chip has passed manufacturing test, it is delivered for integration into a system. During system integration, the proper operation of the chip will need to be verified at least once, and probably more, since the check out and integration process sometimes exposes faults that the manufacturing test missed, and sometimes even causes faults. System integration testing of the chip is accomplished both by running functional diagnostic software, and by utilizing special stand-alone test equipment to perform manufacturing type tests.

Once the system is in use, proper operation of the chip will need to be verified periodically by built-in self test (BIST) software in order to ensure that the chip has not been damaged, or that a latent defect has not developed. System level BIST is accomplished by running functional diagnostic software, but the BIST diagnostics are usually less thorough than integration test diagnostics since integration tests are done in the lab environment and can be written to utilize lab equipment, and because BIST is limited by real time constraints. Again, as VLSI chips become denser, the task of writing diagnostic software for both BIST and for integration testing becomes more complicated and time consuming, and the tests themselves take longer to run and require more memory. The special test equipment required for stand-alone integration testing is also required to be more sophisticated (and expensive) as the chips being tested become denser and faster.

An alternate method of testing VLSI chips for faults is the implementation of a pseudo-random vector generation (PRG) test. As the name implies, test vectors for a PRG test are generated pseudo randomly, thereby eliminating the very expensive procedure of human test vector design. The results of the PRG vectors can be compared against expected results to verify that the chip is fault free. Autonomous self test (AST) is a scheme in which a chip can be commanded to perform a PRG test on itself. With an AST scheme, pseudo-random patterns are generated to excite the core logic of the chip while the results of the excitation are compiled and compared to an expected result, all internally. In order to accomplish this, registers in the chip are serially connected into set scan chains which can be loaded with pseudo-random data from an AST controller, which resides on the chip. During AST, logic clouds (combinational logic that exists between the functional Q output of one or more registers and the functional D input of a register) receive pseudo-random test excitation from scan chains, while the results of the excitation are observed by scan chain registers at the combinational cloud outputs. The results are compiled and compared against an expected result by the AST controller.

Clearly, there are many advantages of implementing an AST scheme test. Manufacturing test becomes less expensive because the only patterns that need be written by a human are those that are required to invoke AST. Also, since the number of vectors that must be externally applied to the chip are greatly reduced, the need for more expensive test support equipment is eliminated. For system integration, the need for stand-alone testers and supporting software is completely eliminated. The complexity, design time, execution time and memory requirements for diagnostic software used for system integration and for BIST are reduced significantly since the software needs only to invoke the chip AST.

Designing logic that is testable by a PRG test imposes new constraints on the designer. The challenge is to drive each primitive element in a logic cloud to all input states required to achieve 100% "stuck at" testing, while propagating the responses to the cloud output, where they are observed by scan chain registers. Stuck-at testing finds failures which are manifested by a circuit node being permanently fixed (i.e., "stuck at") either the high or low state. In order to accomplish this, logic must be designed so that application of a small number of pseudo-random inputs causes a high probability of excitation and observation of all primitive element inputs and outputs.

Counters often cause problems for any type of fault finding tests, and PRG tests are no exception. In order for PRG tests to be effective, each signal node must have a reasonable probability of being observed at both possible logic levels, high and low. The problem with most counter designs is that in order for a particular bit of the counter to be enabled to count, all of the less significant bits must be logic 1's for an up counter, or logic 0's for a down counter, and the counter enable control must be in the "enabled" state. This means that the probability of detecting faults continues to get lower for each bit that a counter has, i.e., the probability of detecting a "stuck at" (SA) fault at the nth bit of a counter is $\frac{1}{2}^n$. The Full Scale (FS) signal is also a problem for PRG test, since FS is simply a logical "AND" function with as many inputs as there are bits in the counter. The probability of the FS signal being active for an n bit standard counter is $\frac{1}{2}^n$. Even for standard counters with a relatively low number of bits, these probabilities of fault detection can make a PRG test of the counter ineffective.

There exists a multitude of different varieties of counters available in MSI packages and as macros for custom gate arrays. However, none of these provide the controllability or observability necessary to make a PRG test feasible. Further, no technique for implementing a fault test of any kind is suggested or implied by the producers of these counters.

There is therefore a need for a counter in a VLSI circuit which is PRG testable.

SUMMARY OF THE INVENTION

A digital counter circuit is described, characterized by a full scale output circuitry for generating an "FS" signal indicating that the counter has reached its terminal count, and by a plurality of counter modules cascaded together to form the counter circuit. Each module in turn comprises full scale module output circuitry for generating a module "FS" output signal when the respective module has reached its terminal count. In accordance with the invention, the counter comprises means for testing the full scale output circuitry via sequences of pseudo-random input vectors during a counter test mode, and in particular, driving the full scale output circuitry with control signals which have an equal probability of being logic one or logic zero. The testing means comprises first and second pseudo-random input generators for generating first and second input test vectors during the test mode. A plurality of probability regeneration logic circuits, one for each counter module, is provided. The logic circuits are responsive to one of the first and second input test vectors and to the FS module output signal of the preceding module for providing the full scale output circuitry with respective control signals that have virtually equal probability of being logic 1 or logic 0 during the counter test mode, thereby providing controllability over the signals which drive the counter full scale output circuitry during the test mode. By providing such controllability, the output circuitry can be tested for stuck at faults during the test mode.

The counter further comprises means for providing additional observability of the counter module full scale outputs.

BRIEF DESCRIPTION OF THE DRAWING

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENT

The invention comprises a digital counter which can be easily and thoroughly tested with a short sequence of random (or pseudo-random) input vectors. This testable counter can be implemented with any number of bits and in a wide variety of functional variations (e.g., up, down, up/down, with or without clear controls). The counter provides a conventional terminal count (TC) output, as well as a "Full Scale" (FS) output, which becomes active when the counter has reached its final count (all 0's for a down counter, all 1's for an up counter), regardless of the count enable input. As is well known, the FS counter output indicates that the counter has reached its terminal count regardless of the state of the counter "enable," in contrast to the "carry out" output, which indicates that the counter has reached its terminal count and the counter is enabled to count.

Several features of the new counter increase the ability of pseudo-random vector generated (PRG) tests to detect stuck at (SA) faults in the PRG testable counter as compared to a conventional counter. These features are pseudo-random input generators, probability regeneration logic and full scale observability logic, as described more fully below.

Figure 1:
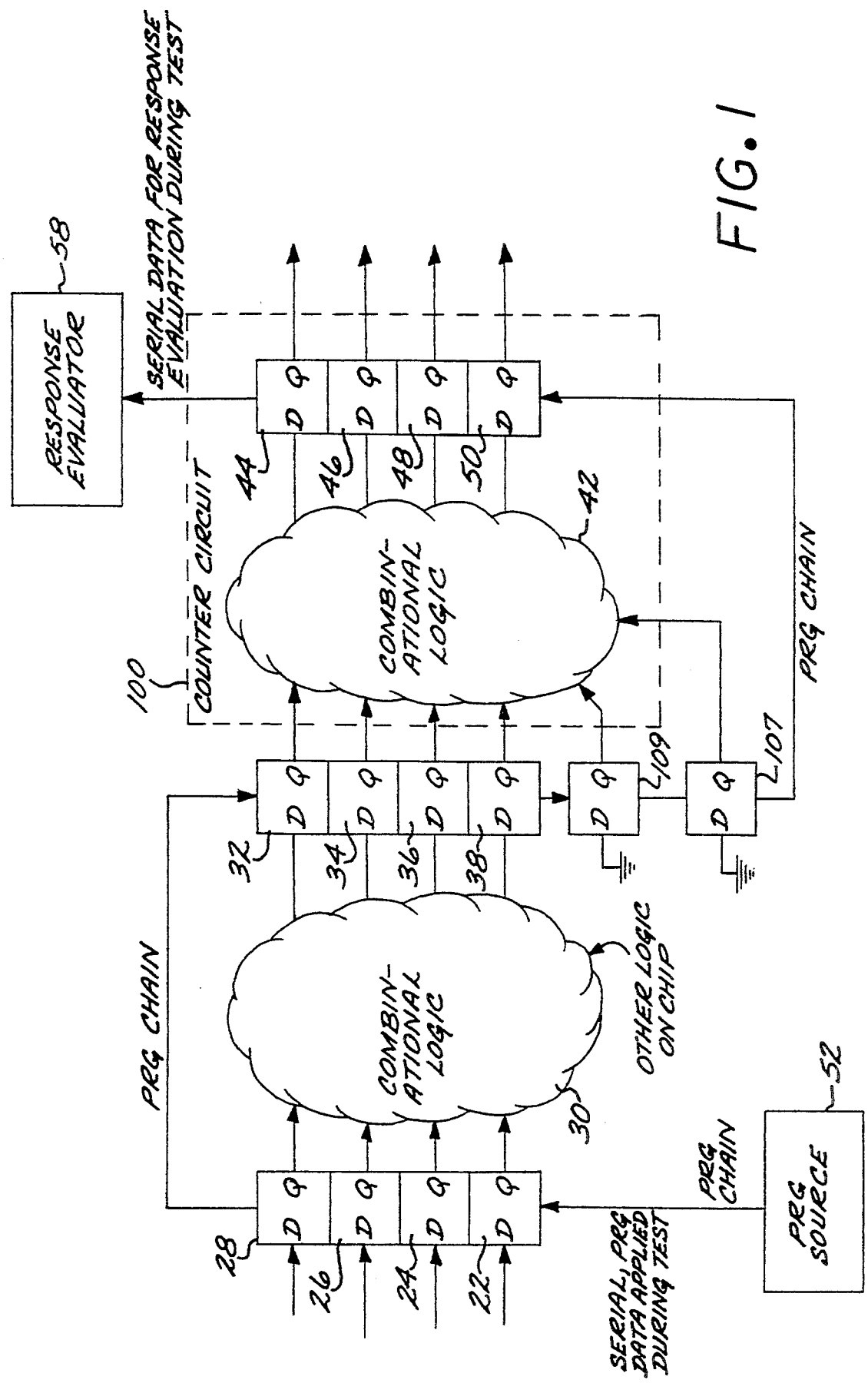
FIG. 1 is a simplified block diagram of a VLSI chip having a counter circuit and comprising a PRG scan chain capability in a test mode.

FIG. 1 is a block diagram of the circuits on an exemplary semiconductor chip which include a counter circuit 100 and which employs PRG scan testing. The circuitry 20 includes a first plurality of input registers 22, 24, 26 and 28 whose Q outputs are connected to a combinational logic cloud 30 comprising other logic on the chip. The logic cloud 30 includes outputs which drive the data inputs of a second plurality of registers 32, 34, 36 and 38. The Q outputs of the second plurality of registers drive the counter circuit 100, and particularly the combinational logic cloud 42 comprising the counter 100. The outputs of the logic cloud 42 in turn drive the D inputs of a third plurality of registers 44, 46, 48 and 50 comprising the counter 100.

It will be seen that the first, second and third plurality of registers can be configured to provide a PRG serial data chain. Each register in this exemplary embodiment has the following inputs: a D input, a freeze input, a serial input and mode controls. The mode controls determine whether the register is operating in the functional (i.e., parallel) mode, or in the serial (i.e., scan) mode. In the functional mode, the Q output is determined by the D and the freeze inputs. When the freeze input is high, the D input will be transferred to the Q output upon receipt of an active edge clock. When the freeze input is low, the Q output retains its state after receipt of an active clock edge. When in the serial mode, the serial input is transferred to the Q output upon receipt of an active edge clock.

A source 52 of serial PRG data is connected to a serial in data port of the register 22. The Q output port of the register is connected in the serial mode to the serial input port of the next register in the chain, register 24. The Q output port of the register 28 is connected in the serial mode to the serial input port of the register 32 of the second plurality. In accordance with the invention, the Q output port of register 38 of the second plurality of registers is connected to the serial input port of a register 109, whose Q output port is connected to the serial input port of another register 107. The Q output port of register 107 is connected to the serial input port of register 50 of the third plurality of registers comprising the counter circuit 40. The serial chain continues, and the Q output port of register 44 is connected to a response evaluator 56.

As will be described in more detail below, the registers 107 and 109 comprise respective pseudo-random input generators for the counter circuit 100 in the test mode.

During the test mode, all the registers are put in the serial mode. The PRG source 52 applies the serial PRG test vector to the PRG chain by serially clocking the vector data into the register chain. using 14 clock pulses in this example since the exemplary PRG chain of FIG. 1 includes 14 registers.

Once the PRG test vector has been propagated through the PRG chain, the test vector data appears at the respective Q output of each register. The test vector data will stimulate the combinational logic clouds 30 and 42,and the response of the stimulation is provided to the respective D inputs of the second and third sets of registers. At this point, the PRG source 52 controls the PRG chain registers to operate in the parallel mode, so that the response to the stimulation is clocked into the registers. Now the PRG chain registers are again put in the serial mode, and the contents of the registers are serially clocked through the registers to the response evaluator 58. The response data are compiled and compared against an expected result for that PRG test vector for a fully operational circuit. Deviations from the expected response indicate that the chip has a defect. Typically, many PRG test vectors will be employed to fully test the part.

Figure 2:
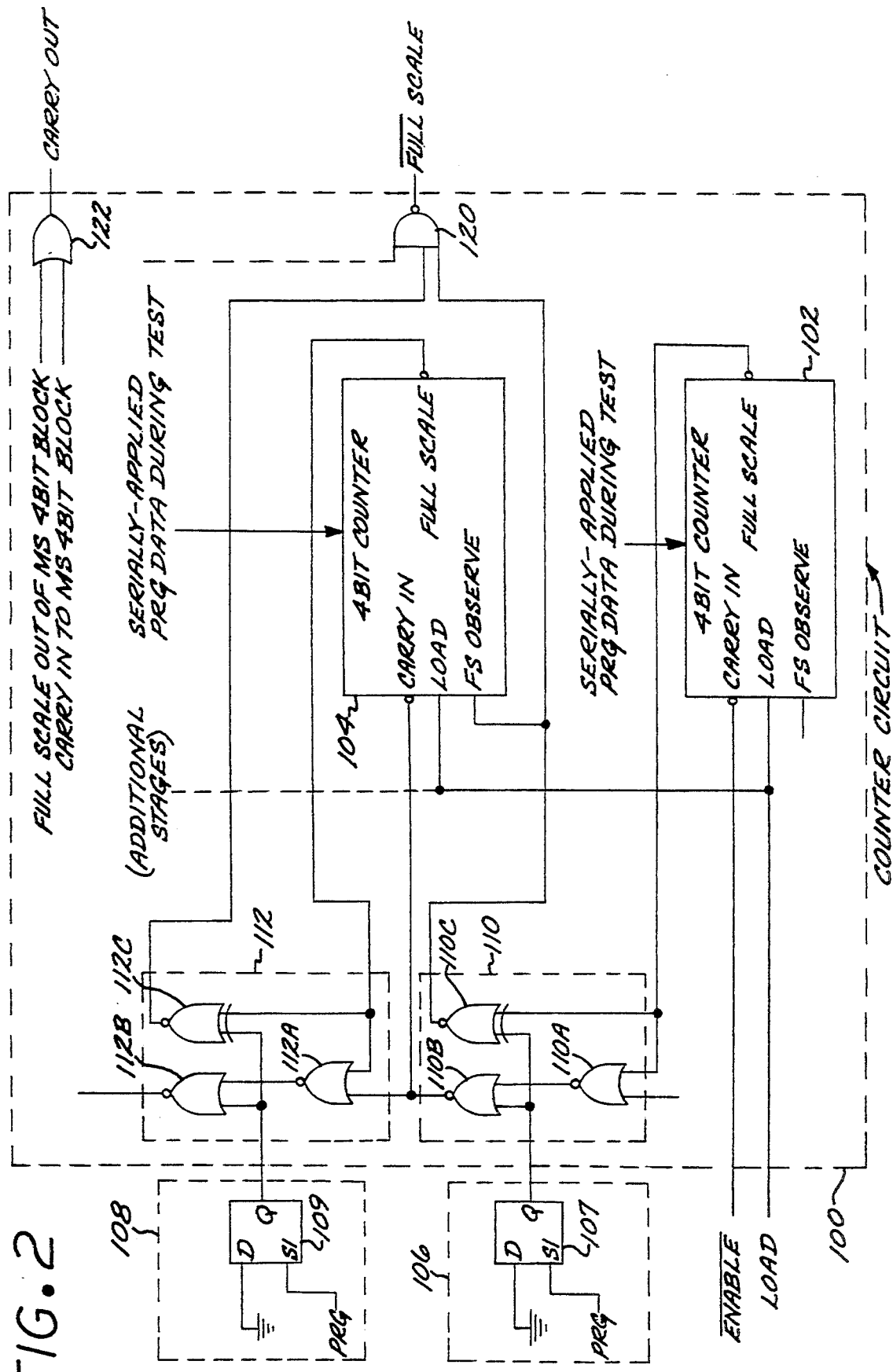
FIG. 2 is a schematic block diagram illustrating the connection of 4-bit counter blocks to form a larger PRG testable counter.

The PRG testable counter in accordance with the invention solves the aforementioned problems by injecting controllability into the counter and by providing extra observability for the internal counter signals that need it. An exemplary counter circuit 100 of FIG. 1 embodying the invention is shown in the block diagram of FIG. 2. This embodiment is depicted as comprising a plurality of four bit counter modules 102,104 . . . , cascaded together to form a larger PRG testable counter. While only two counter modules are shown in FIG. 2, obviously many more counter modules may be cascaded together, or each module may comprise a number of bits different than four as determined by the requirements for a particular application. Each counter module generates a full scale output signal to indicate that the counter module has reached its terminal count and is ready to roll over when next enabled. The full scale output of each module is connected to the carry-in terminal of the next counter module, and also to the full scale gate 120 for the counter circuit 100.

The controllability for the counter 100 in the PRG test mode is provided by the pseudo-random input generators 106 and 108. Each generator comprises a register for which the D input is connected to a logic 0 and the scan input, i.e., the serial data input, is connected to a PRG chain to receive the pseudo-random number vector. The PRG chain is the serially-connected chain of registers, configured during test mode, which is driven by the pseudo-random data source 52 as described with respect to FIG. 1. Thus, generator 106 comprises register 107, and generator 108 comprises register 109. The outputs of the registers 107 and 109 are always logic 0 during functional operation of the counter, and is pseudo-random during PRG test. Therefore, the registers 107 and 109 have no effect on the counter 100 during normal functional operations.

Only two pseudo-random input generators are required for the counter circuit 100. The outputs from the generators 106 and 108 are provided to respective alternative, successive probability regeneration logic circuits comprising the counter 100. Thus, the pseudo-random output of generator 106 is connected to probability regeneration logic circuit 110 for the first counter state 102, and the output from generator circuit 108 is connected to probability regeneration logic circuit 112 for the second counter circuit 104. For each additional counter stages (not shown) comprising the counter 100, there will be corresponding probability regeneration logic circuits like the circuits 110 and 112. The respective outputs of the pseudo-random input generators 106 and 108 are applied to alternating ones of these additional probability regeneration logic circuits.

The counter circuit 100 further includes the Full Scale NAND gate 120, which provides a FULL SCALE output signal which is active low in this example. The inputs to the gate 120 are provided by signals which, during the operational mode are equivalent to the full scale outputs of each module circuit 102,104, . . . . . A primary purpose of the invention is to provide reliable testing of the Full Scale gate 120 and the respective counter module gates which generate the full scale outputs for the respective counter modules.

The circuit 100 also includes a Carry Out gate 122, which ORs the Full Scale output of the most significant 4 bit counter module with the Carry In signal to that counter module.

During the test mode, PRG data is serially applied to the respective 4 bit counter modules, as indicated in FIG. 2 and as described above with respect FIG. 1.

The pseudo-random test inputs from the generators 106 and 108 are used by the probability regeneration logic circuits 110, 112, . . . , to provide the following 4-bit counter module or stage of the counter circuit 100 with controls that have equal probability of being logic 1 or 0 during PRG test.

The logic circuit 110 comprises NOR gates 110A and 110B, and EXOR gate 110C. The output from the generator 106 is connected as an input to each of the gates 110B and 110C. The inputs to the gate 110A are the ENABLE signal and the Full Scale output from the first counter module circuit 102. The output of the gate 110A also serves as an input to the gate 110B. The Full Scale output from the module circuit 102 provides a second input to the EXOR gate 110C.

The regeneration logic circuit 112 is similar to circuit 110, except that the output of the gate 110B serves as an input to the gate 112A instead of the ENABLE signal, as in the case of the gate 110A. Thus, the circuit 112 comprises NOR gates 112A and 112B, and EXOR gate 112C.

During test, the signals out of the regeneration logic circuits 110, 112, . . . are pseudo-random with a probability of "high" being very close to $\frac{1}{2}$. Thus, the subsequent gates 112A, 202/252 (FIGS. 3 and 4), and the Full Scale gate, have a high probability of being tested.

One set of controllability registers (i.e., the registers 107 and 109) can be used for all of the counter modules on the chip, as well as for other logic functions that may require added controllability in order to achieve an acceptable fault detection level.

Figure 3:
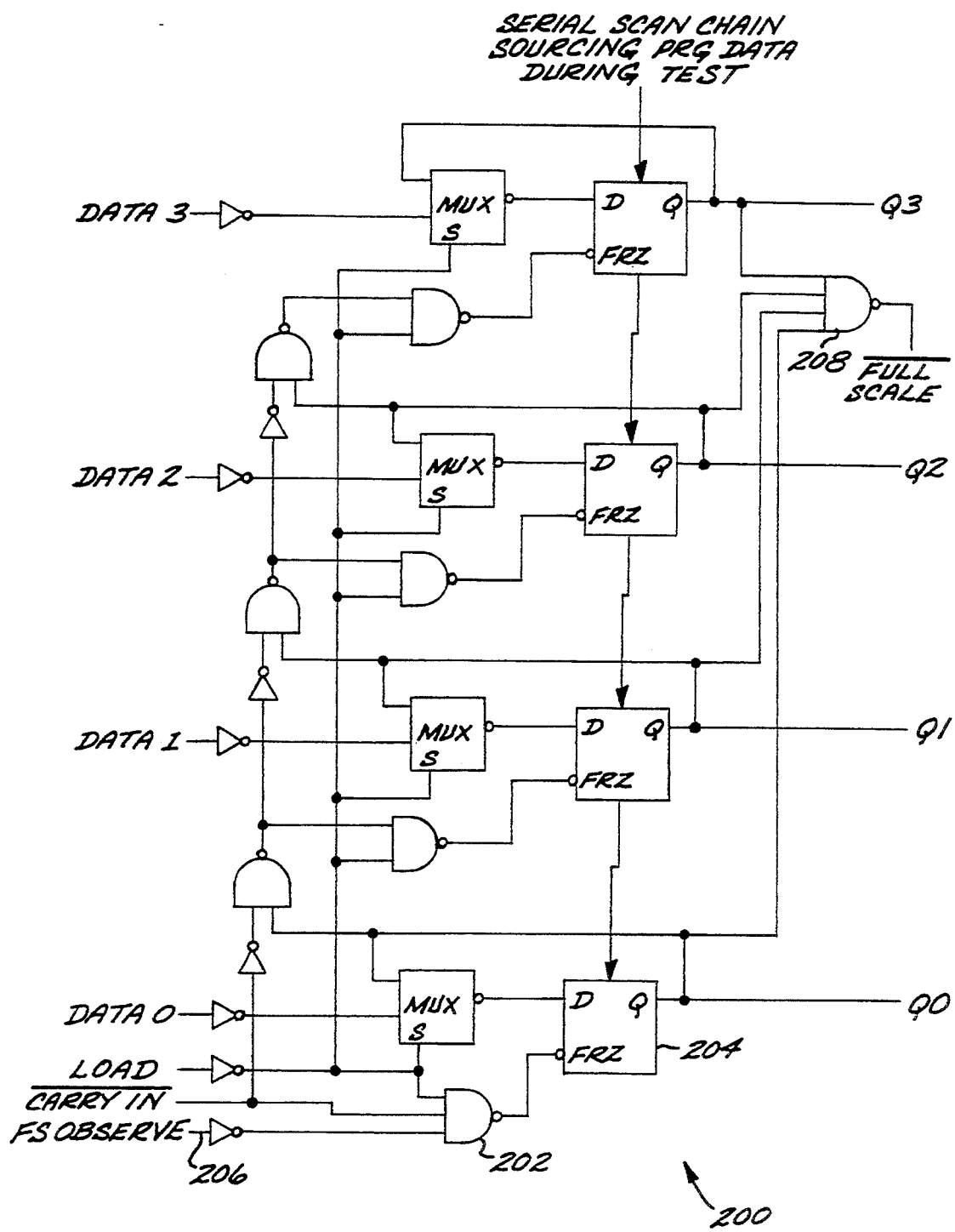
FIG. 3 is a schematic block diagram of a 4-bit up counter block which may comprise the PRG testable counter of FIG. 2.
Figure 4:
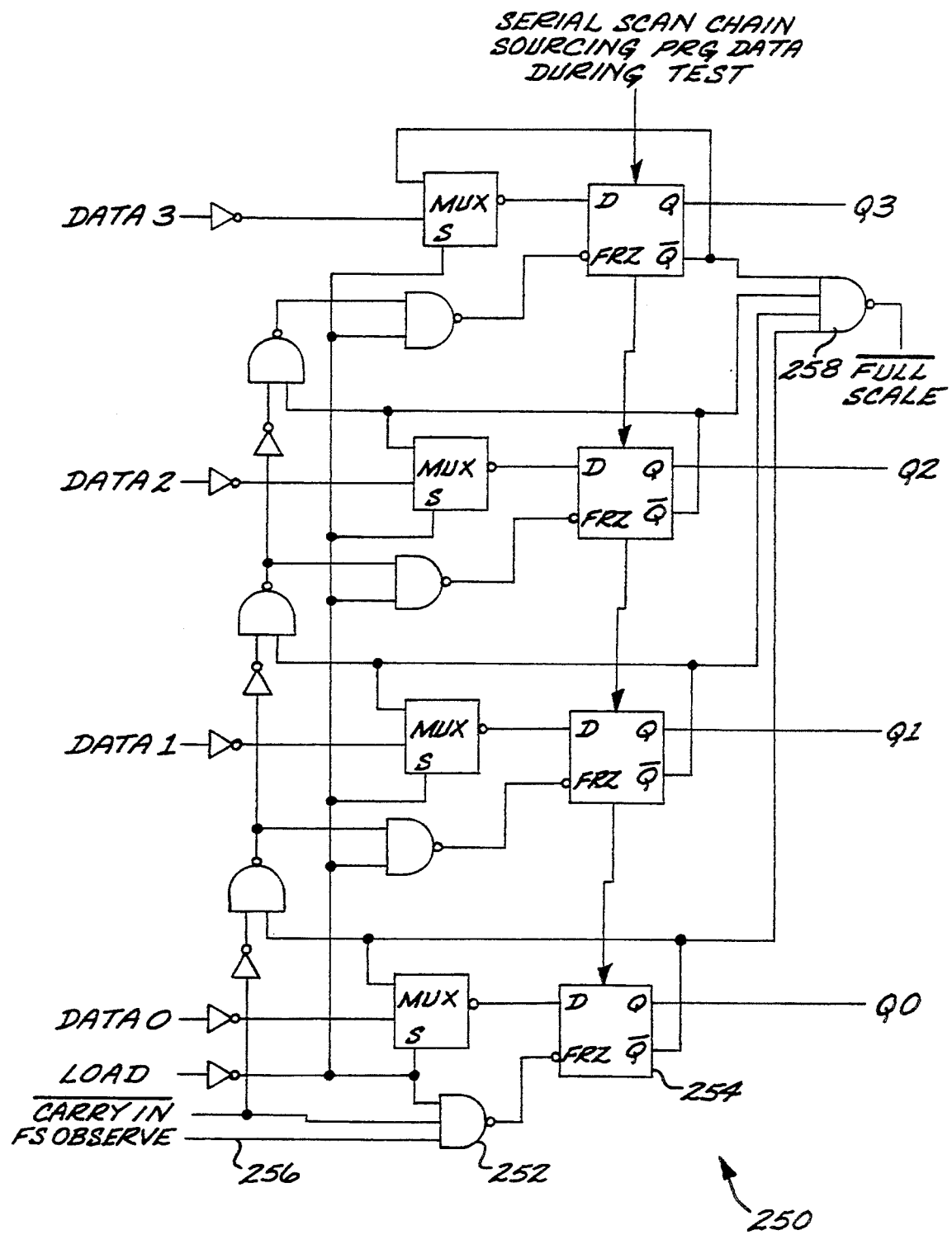
FIG. 4 is a schematic block diagram of a 4-bit down counter block which may comprise the PRG testable counter of FIG. 2.

The counter circuit 100 may comprise either an up counter or a down counter. FIG. 3 illustrates an exemplary 4-bit up counter module circuit 200 which may be used as the modules 102, 104, . . . of the counter 100 of FIG. 1. FIG. 4 illustrates an exemplary 4-bit down counter module circuit 250 which may be used as the modules 102, 104, . . . of the counter 100. Depending on whether the counter 100 is an up or down counter, either the circuit of FIG. 3 or FIG. 4 may be used. The full scale output of a counter is difficult to observe because it is AND gated with the Full Scale signals from previous counter modules making the observe probability extremely low. In order to thoroughly test the counter 100, the full scale gate outputs from each stage or module need extra observability, which is provided by the full scale observability logic of the following 4-bit module. The observability is provided by an extra input in the gate that drives the freeze control for the least significant bit register of each of the 4-bit counter modules 102, 104, . . . (FIGS. 3 and 4). The freeze control input to the register will determine whether the data value of the register will be transferred to the Q output when clocked. If the freeze control input has a value of logic one, then the data value will be clocked to the Q output. However, a freeze control input of logic zero will cause the present value of the Q output to be frozen even if the register is clocked. The extra input to the freeze control register is redundant for functional operation, but provides a means of providing observability for the module FS gate outputs during PRG test with a negligible transistor count impact. For example, the FS observe gate input, along with the XOR gate 110C, provides a path to observe the Full Scale output of the previous counter module 102, independently from the state of the output states of further previous counters.

Thus, in the module circuit 200 of FIG. 3, the NAND gate 202 drives the freeze control terminal of register 204 for the least significant bit of the counter module circuit 200. The full scale gate observability logic comprises the extra input 206 ("FS OBSERVE") to the gate 202. In the module circuit of FIG. 4, the NAND gate 252 drives the freeze control terminal of register 254 for the least significant bit of the counter module circuit, and the full scale gate observability logic comprises an extra input 256 ("FS OBSERVE") to the gate 252.

The extra input to the freeze control of the register for the least significant bit of the first module circuit 102 comprising the circuit 100 is a logic "1." The extra input for the observability logic for each successive module circuit is provided by the full scale output signal for the preceding module circuit as shown in FIG. 2.

The manner in which the observability of the module full scale gates is obtained can be seen from exemplary FIGS. 2 and 3. The full scale output from counter module 102 is an input to EXOR gate 110C, as well as to NOR gate 110A. The output of gate 110C is connected as the FS OBSERVE input to the next successive counter module. During the test mode, the FS OBSERVE signal may be observed by the least significant bit register of the next module, in that the FS OBSERVE signal will either freeze this register or permit it to operate to transfer data from the D to the Q port. The output of the register will be observed by the response evaluator 58, and compared against the expected result for that predetermined pseudo-random vector. The EXOR gate 110C does not mask the full scale output from the register, since its output depends both on the value of the pseudo-random vector and the full scale output of the preceding stage.

The output of the Full Scale gate 120 can be observed during the test mode by a register (not shown explicitly in FIG. 2).

An advantage of this manner of observing the full scale output of each counter module conserves the gate count, since it makes use of a register already needed for normal functional operations of the counter, while not affecting the normal function when not in the test mode.

Because faults in a PRG testable counter are more readily detected by PRG test than faults in a conventional counter, using a PRG testable counter in accordance with present invention instead of a conventional counter in a VLSI design can help the chip design to reach the contractually required level of fault detection. It also reduces the chance of a faulty chip going undetected and ultimately causing a functional failure in a tactical environment. This is particularly necessary for VLSI which uses built-in, self-testing features.

The advantage of the PRG testable counter is increased testability. The disadvantages of the PRG testable counter are that the transistor count may be slightly higher and that some of the internal propagation delays are slightly greater. However, for implementation in a VLSI chip, the disadvantages of a PRG testable counter are far outweighed by the advantages, since VLSI chips currently available offer usable transistor counts in excess of 200,000 and typical gate delays of less than 1 ns.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A digital counter circuit fabricated on a semiconductor integrated circuit, said digital counter circuit comprising:
   a full scale output circuitry for generating an "FS" signal indicating that the counter has reached its terminal count;
   a plurality of counter modules cascaded together to form said counter circuit, each module in turn comprising full scale module output circuitry for generating a module "FS" output signal when the respective module has reached its terminal count, said counter FS output signal being active only when each of the module FS signals is active; and
   means for testing said full scale output circuitry through sequences of pseudo-random input vectors during a counter test mode, said testing means comprising means for providing said full scale output circuitry with respective control signals that have virtually equal probability of being logic one or logic zero during said counter test mode, thereby providing controllability over the signals which drive said counter full scale output circuitry.

2. The circuit of claim 1 wherein said full scale output circuitry comprises means for performing a logical AND function on said module FS output signals, and said testing means comprises means for testing the operation of said logical AND function means by providing as inputs to said logical AND function means said control signals that have virtually equal probability of being logic one or logic zero in value.

3. The circuit of claim 1 further comprising first and second pseudo-random input generators for providing first and second pseudo-random input test signals during said test mode, said first and second input generators comprising respective registers which receive a serial scan test vector during a counter test mode.

4. The circuit of claim 3 wherein said respective registers comprising said input generators in turn comprise a set of registers which are serially connected during a circuit test mode, and wherein said input vector is serially propagated into said set of serially connected registers during said test mode.

5. The circuit of claim 4 wherein said set of registers are put into a parallel mode of operation after said test vector has been propagated into said set of registers, and said circuit is stimulated by said test vector during said test mode, and wherein data indicative of the circuit response to said stimulation is loaded into registers comprising said set of registers, said registers are again serially connected, and said response data is serially propagated out of said set of registers to a response evaluator.

6. The circuit of claim 5 wherein said response evaluator compares said response data to predetermined expected response data for said test vector, and indicates that a fault exists if said response data differs from said expected response data.

7. The circuit of claim 1 further comprising means for observing said module "FS" output signals upon stimulation of said circuit with said input vector and comparing said observed signals with predetermined expected response signals corresponding to the expected circuit response for that test vector.

8. The circuit of claim 7 wherein each counter module comprises at least one register per counter bit, said register including by a freeze input port, and wherein said means for observing said module "FS" output signals comprises, for each module:
   an input to a gate driving the freeze input for the least significant bit register of the next successive counter module; and
   wherein said FS signal for the preceding counter module drives said probability regeneration logic circuit, said logic circuit providing said input to said gate driving said freeze input.

9. A digital counter circuit, comprising:
   a full scale output circuitry for generating an "FS" signal indicating that the counter has reached its terminal count;
   a plurality of counter modules cascaded together to form said counter circuit, each module in turn comprising full scale module output circuitry for generating a module "FS" output signal when the respective module has reached its terminal count, said counter FS output signal being active only when each of the module FS signals is active;
   means for testing said full scale output circuitry via sequences of pseudo-random input vectors during a counter test mode, said testing means comprising:
   first and second pseudo-random input generators for providing first and second pseudo-random input test signals during said counter test mode; and
   a plurality of probability regeneration logic circuits, one for each counter module, said logic circuits responsive to one of said first and second input test signals and to the FS module output signal of the preceding module for providing said full scale output circuitry with respective control signals that have virtually equal probability of being logic 1 or logic 0 during said counter test mode, thereby providing controllability over the signals which drive said counter full scale output circuitry.

10. The circuit of claim 9 wherein said control signals drive said full scale output circuitry during said test mode.

11. The circuit of claim 9 wherein said full scale output circuitry comprises means for performing a logical AND function on said module "FS" output signals, and said testing means comprises means for testing the operation of said logical AND function means.

12. The circuit of claim 9 wherein said first and second input generators comprise respective registers which receive a serial scan test vector during a counter test mode.

13. The circuit of claim 12 wherein said respective registers comprising said input generators in turn comprise a set of registers which are serially connected during a circuit test mode, and wherein said input vector is serially propagated into said set of serially connected registers during said test mode.

14. The circuit of claim 13 wherein said set of registers are put into a parallel mode of operation after said test vector has been propagated into said set of registers, and said circuit is stimulated by said test vector during said test mode, and wherein data indicative of the circuit response to said stimulation is loaded into registers comprising said set of registers, said registers are again serially connected, and said response data is serially propagated out of said set of registers to a response evaluator.

15. The circuit of claim 14 wherein said response evaluator compares said response data to predetermined expected response data for said test vector, and indicates that a fault exists if said response data differs from said expected response data.

16. The circuit of claim 9 further comprising means for observing said module "FS" output signals upon stimulation of said circuit with said input vector and comparing said observed signals with predetermined expected response signals corresponding to the expected circuit response for that test vector.

17. The circuit of claim 16 wherein each counter module comprises at least one register per counter bit, said register characterized by a freeze input port, and wherein said means for observing said module "FS" output signals comprises, for each module:
   an input to a gate driving the freeze input for the least significant bit register of the next successive counter module; and
   wherein said FS signal for the preceding counter module drives said probability regeneration logic circuit, said logic circuit providing said input to said gate driving said freeze input.

18. In a digital counter circuit on a VLSI chip, said counter circuit including a full scale output circuitry for generating an "FS" signal indicating that the counter has reached its terminal count, and a plurality of counter modules cascaded together to form said counter circuit, each module in turn comprising full scale module output circuitry for generating a module "FS" output signal when the respective module has reached its terminal count, said counter FS output signal being active only when each of the module FS signals is active, a method for testing said counter circuit with pseudo-random input test vectors, comprising a sequence of the following steps:
   stimulating said full scale output circuitry with predetermined pseudo-random control signals which have virtually equal probability of being logic one or logic zero; and
   observing said counter "FS" output signal while said output circuitry is stimulated and comparing said output signal with a predetermined expected response signal for said control signals.

* * * * *